(12) United States Patent
Harima

(10) Patent No.: US 8,710,931 B2
(45) Date of Patent: Apr. 29, 2014

(54) PIEZOELECTRIC DEVICE AND FABRICATING METHOD THEREOF

(75) Inventor: Hidenori Harima, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 31 days.

(21) Appl. No.: 13/477,072

(22) Filed: May 22, 2012

(65) Prior Publication Data
US 2012/0319792 A1 Dec. 20, 2012

(30) Foreign Application Priority Data
Jun. 14, 2011 (JP) .................................. 2011-132336

(51) Int. Cl.
*H03B 5/32* (2006.01)
(52) U.S. Cl.
USPC ............................................ 331/68; 331/158
(58) Field of Classification Search
USPC ................................................... 331/68, 158
See application file for complete search history.

(56) References Cited

U.S. PATENT DOCUMENTS 7,522,006 B2 * 4/2009 Mizumura et al. ............ 331/158
2010/0060367 A1 * 3/2010 Harima et al. .................. 331/68

FOREIGN PATENT DOCUMENTS

| JP | 2004-356912 | 12/2004 |
| JP | 2010-232806 | 10/2010 |
| JP | 2010-252210 | 11/2010 |

* cited by examiner

*Primary Examiner* — Joseph Chang
(74) *Attorney, Agent, or Firm* — Jianq Chyun IP Office

(57) ABSTRACT

A piezoelectric device and a fabricating method thereof are provided. Variation of output frequency is suppressed by forming an organic resin to protect an IC chip that is mounted in a cavity of a container body, and damage that may occur to the IC chip during the mounting process is prevented. The piezoelectric device includes a container body, a crystal resonator, an IC chip and a cover body. A surface of the IC chip, which is a mounting surface for mounting to the container body, has bumps thereon for connecting to terminal pads of a circuit wiring pattern configured on a bottom surface of a bottom cavity of the container body, and the other surface of the IC chip has an insulating protective sheet adhered and fixed thereon.

11 Claims, 6 Drawing Sheets

PIEZOELECTRIC DEVICE AND FABRICATING METHOD THEREOF

CROSS-REFERENCE TO RELATED APPLICATION

This application claims the priority benefit of Japan application serial no. 2011-132336, filed on Jun. 14, 2011. The entirety of the above-mentioned patent application is hereby incorporated by reference herein and made a part of this specification.

BACKGROUND OF THE INVENTION

1. Field of the Invention

The invention relates to a piezoelectric device and particularly relates to a surface mount piezoelectric device, which suppresses frequency variation caused by humidity permeating an encapsulation resin from the external atmosphere, and a fabricating method of the surface mount piezoelectric device.

2. Description of the Related Art

As a typical example of crystal oscillator, surface mount piezoelectric devices (referred to as crystal oscillator or oscillator in this specification), are extensively used as a signal reference source of frequency, time, and etc. in portable electronic devices. One type of the surface mount piezoelectric devices is an H-shaped surface mount piezoelectric device. The H-shaped surface mount piezoelectric device includes a container body (package) that is shaped like the English letter H in a longitudinal cross-sectional view thereof, wherein the upper concave of the H-shaped container body is a top cavity for disposing a crystal resonator, and the lower concave of the H-shaped container body is a bottom cavity for mounting an IC chip that forms a temperature control circuit or an oscillation circuit. The IC chip mounted to the container body is a surface mount type IC chip, and the piezoelectric device (oscillator), mounted with the aforementioned crystal resonator and IC chip, is the surface mount piezoelectric device.

FIG. 8 is a schematic view depicting an exemplary configuration of a conventional H-shaped surface mount piezoelectric device. In this configuration, the container body 1 is a multi-layer structure formed of ceramic constructive layers 1a, 1b, 1c, and 1d. In this example, a printed circuit is respectively formed on one or two sides of each of the constructive layers 1a, 1b, 1c, and 1d, that is, HTCC (high temperature cofired ceramics). However, the number of the ceramic constructive layers is not limited to the above, and the container body 1 may include only one layer in other examples. In that case, the container body 1 is not a multi-layer structure. Moreover, LTCC (low temperature cofired ceramics) is also applicable according to the wiring material that is formed in the ceramics.

A crystal resonator 4 is disposed in the top cavity 2 that constitutes a part of the container body 1 of the H-shaped surface mount piezoelectric device. The crystal resonator 4 is mostly a crystal oscillator, and a terminal part of the crystal resonator 4 is connected with a wiring formed on an interior surface of the top cavity 2 via an electrically-conductive adhesive agent 4a. The crystal resonator 4 is fixed to the container body 1 at a side of the crystal resonator 4 by the connection part. Moreover, the top cavity 2 is sealed from the external atmosphere by a cover body 6 that is formed of a metal material and adhered to the container body 1 via a metal ring 5 disposed between edges of the container body 1 and the top cavity 2. Generally, the metal ring 5 and the cover body 6 are welded to the container body 1 via a silver solder 5a by using Kovar, which has a coefficient of thermal expansion close to that of ceramics. The cover body 6 is fixed to the metal ring 5 by seam welding.

An IC chip 8, which includes a circuit for generating a desired frequency output based on an oscillation output of the crystal resonator 4, is surface-mounted onto a bottom surface of the bottom cavity 3, which constitutes a part of the container body 1. In addition, the IC chip 8 can also serve as a temperature control circuit. The IC chip 8 is surface-mounted by a means, such as ultrasonic bonding, and using a flip chip bonder or a chip mounter to fix bumps 9, formed of solder balls on a mounting surface (one side) of the IC chip 8, to terminal pads 7a of a circuit wiring pattern 7 formed on the bottom surface of the bottom cavity 3.

The circuit wiring patterns of the container body 1 at the side of the IC chip 8 and the side of the crystal resonator 4 are connected with each other via a via hole (not shown in the figure) that is configured in the constructive layer 1b of the container body 1. In addition, a plurality of terminals 10 are disposed on edges of the bottom cavity 3 for connecting with an external circuit via surface mounting. The terminals 10 and the circuit wiring patterns of the container body 1 are also connected via a through hole (not shown in the figure) configured in the constructive layers of the container body 1.

An organic resin 13 fills the bottom cavity 3 where the IC chip 8 is mounted, including a gap between the bottom cavity 3 and the mounting surface of the IC chip 8, for protecting the IC chip 8 from damage caused by an external shock. Generally an epoxy resin is used as the organic resin 13.

RELATED ART

The following references disclose, for example, techniques regarding what elements are embedded in resin or covered by thin films of materials other than resin when the elements are disposed in the cavity of the piezoelectric device. Specifically, Publication JP 2004-356912 discloses a crystal device, wherein the crystal resonator and IC chip are respectively disposed in cavities formed in the container body of the piezoelectric device, and the IC chip is sealed by an epoxy resin. Further, Publication JP 2010-232806 discloses an oscillator, wherein the crystal resonator and IC chip are respectively disposed in cavities of the container body of the piezoelectric device, and the crystal resonator is mounted under protection of a fluororesin. Moreover, Publication JP 2010-252210 discloses an oscillator that has cavities, the same as above, for disposing the crystal resonator and IC chip, and the IC chip is mounted and protected by a conductor film for heat dissipation.

PROBLEM TO BE SOLVED BY THE INVENTION

However, the surface mount piezoelectric devices that have the above-described structures encounters the following unsolved problems. FIG. 9 is an enlarged schematic cross-sectional view of a part of FIG. 8, as indicated by the arrow B. In FIG. 9, the IC chip 8 is mounted in the bottom cavity 3 of the container body 1 and embedded in the organic resin 13, such as an epoxy resin. The organic resin that fills the space between the IC chip 8 and the container body 1, as indicated by the double-headed arrows in FIG. 9, is a dielectric. Therefore, there is a fixed stray capacitance. The stray capacitance is taken into consideration when the piezoelectric device is designed; however, as commonly known to persons in the art, the organic resin is usually hygroscopic and may absorb humidity from the external atmosphere in the environment where the mounting machine is used. As a result, the stray capacitance varies. The variation of the stray capacitance is influential to the parameters of the IC chip or the circuit of the container body, which consequently changes the output frequency of the piezoelectric device.

The same as FIG. 9, FIG. 10 is also an enlarged schematic cross-sectional view of the part of FIG. 8. FIG. 10 illustrates other unsolved problems besides the problem of FIG. 9. The IC chip 8 is surface-mounted to the bottom cavity 3 of the container body 1, and then the organic resin 13 is poured into the bottom cavity 3 to fill the bottom cavity 3 and the space between the bottom cavity 3 and the IC chip 8. However, in the process of mounting the IC chip 8 to the bottom cavity 3 of the container body 1, although uncommon, a part of the IC chip 8 might hit a corner of the container body 1 and cause damage to the IC chip 8. An example of the damage to the IC chip 8 is indicated by the arrow C in FIG. 10. As a result, the probability of defective piezoelectric devices increases.

SUMMARY OF THE INVENTION

Accordingly, the invention provides a surface mount piezoelectric device, which is capable of suppressing variation of output frequency by filling an organic resin to protect an IC chip mounted in the cavity of the container body and preventing the IC chip from damage that may occur during the mounting process, and a fabricating method of the surface mount piezoelectric device.

In view of the above, a surface mount piezoelectric device according to the invention is characterized in that: an IC chip includes a bump, configured on a mounting surface of the IC chip facing the container body and connected with terminal pads of a circuit wiring pattern configured on a bottom surface of the bottom cavity; and a protective sheet having insulativity and adhered to a back surface of the IC chip, opposite to the mounting surface.

Additionally, a fabricating method of the surface mount piezoelectric device according to the invention is characterized by the following. A semiconductor wafer including a plurality of the IC chips is provided. The semiconductor wafer has a laminated circuit forming surface and a back surface at the other side of the laminated circuit forming surface. After the back surface is polished to a fixed thickness, an insulating protective sheet, formed of an organic resin, is adhered to completely cover the back surface of the semiconductor wafer. Then, the semiconductor wafer is cut into separate IC chips with protective sheets thereon. In the bottom cavity of the container body, the bumps formed on one surface, i.e. mounting surface, of the IC chip are connected to the terminal pads of the circuit wiring pattern configured on the bottom surface of the bottom cavity. And, the IC chip is mounted in the bottom cavity, wherein a space exists between the container body and the IC chip, the space includes a gap between the mounting surface of the IC chip and the container body, and the protective sheet is exposed outside the container body.

EFFICIENCY OF THE INVENTION

Since no organic resin layer is formed between the mounting surface of the IC chip and the container body, stray capacitance variation caused by the humidity absorbed from the atmosphere is prevented. Accordingly, variation of the oscillation frequency is suppressed and a stable output frequency is obtained.

Moreover, the insulating protective sheet that is formed of organic resin and adhered to the back surface at the other side of the mounting surface of the IC chip prevents damage that may occur when the IC chip contacts the sidewall or corner of the bottom cavity during the mounting process. In addition, because the process of filling the organic resin after disposing the IC chip in the cavity is omitted, the overall fabricating processes are reduced to lower the costs. In the case that the organic resin is filled separately after the IC chips are disposed in the cavities, filling uniformity is difficult to maintain. By comparison, adhesion of the resin sheet is very easy in the phase of the semiconductor wafer, and a thickness uniformity can be maintained.

DESCRIPTION OF THE EMBODIMENTS

Exemplary embodiments of the invention are described below with reference to the accompanying drawings.

First Embodiment

Figure 1:
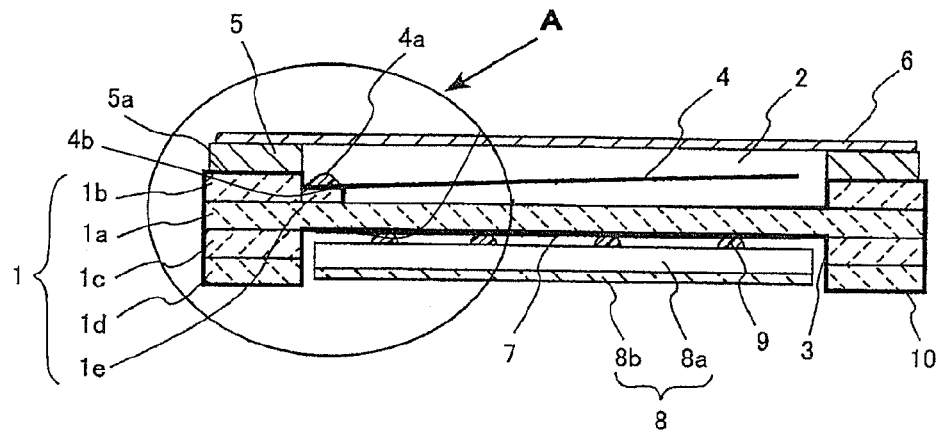
FIG. 1 is a schematic longitudinal cross-sectional view of an H-shaped surface mount piezoelectric device according to the first embodiment of the invention.
Figure 2:
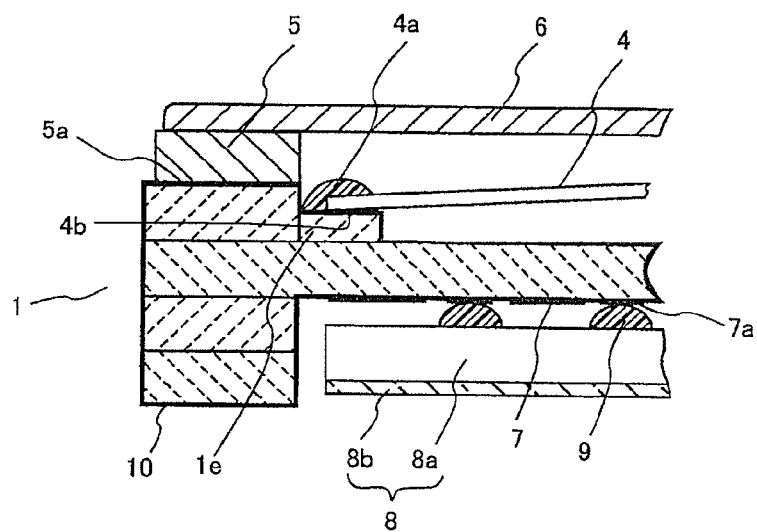
FIG. 2 is a schematic longitudinal cross-sectional view of a part of FIG. 1, as indicated by the arrow A.

FIG. 1 is a schematic longitudinal cross-sectional view of an H-shaped surface mount piezoelectric device according to the first embodiment of the invention. In addition, FIG. 2 is a schematic longitudinal cross-sectional view of a part of FIG. 1, as indicated by the arrow A. In this embodiment, a container body 1 is a multi-layer structure that includes ceramic constructive layers 1a, 1b, 1c, and 1d. The container body 1 is an HTCC (high temperature cofired ceramics) having a printed circuit respectively formed on a side or both sides of each of the constructive layers 1a, 1b, 1c, and 1d. The container body 1 further has a top cavity 2 and a bottom cavity 3.

A crystal resonator 4 is disposed in the top cavity 2 that forms a part of the container body 1 of the H-shaped surface mount piezoelectric device. Generally, the crystal resonator 4 is a crystal oscillator, and a terminal part of the crystal resonator 4 is connected with a wiring that is formed on an interior surface of the top cavity 2 via an electrically-conductive adhesive agent 4a. The crystal resonator 4 is fixed to the container body 1 by a connection part at one side of the crystal resonator 4. In order to accentuate this feature, the crystal resonator 4 is slightly tilted as shown in FIG. 1. Further, the top cavity 2 is sealed from the external atmosphere by a cover body 6, which is formed of a metal material and adhered to the container body 1 via a metal ring 5 that is configured between edges of the container body 1 and the top cavity 2 and surrounds the top cavity 2. The metal ring 5 and the cover body 6 are generally welded with the container body 1 via a silver solder 5a with use of Kovar. The cover body 6 is seam-welded with the metal ring 5. However, it should be noted that, the material of the metal ring 5 and the cover body 6 is not limited to the above; other metal materials that have the same thermal expansion coefficient as ceramics are also applicable.

In addition, an IC chip 8 is surface-mounted in the bottom cavity 3 that forms a part of the container body 1, wherein the IC chip 8 includes a circuit for generating a required frequency output based on an oscillation output of the crystal resonator 4. The IC chip 8 includes a chip body 8a and a resin sheet 8b. The resin sheet 8b is adhered and fixed to a back surface of the IC chip 8, wherein the back surface is on the other side of a bump-forming surface, which is for mounting the IC chip 8 to the container body 1, and the back surface faces outwards. In this embodiment, a material of the resin sheet 8b is a thermosetting epoxy resin, and preferably a suitable filler, made of an inorganic material such as silicon particles or flakes, etc., is mixed thereinto, so as to increase mechanical strength, maintain toughness, and improve thermal expansion property. Needless to say, sheets of other resin materials that have the same properties as the resin sheet are also applicable.

Furthermore, the IC chip 8 is formed by an oscillation circuit, a PLL circuit, a multiplier circuit, an output circuit, and etc., for providing a desired frequency output according to the oscillation frequency of the crystal resonator 4. However, in other embodiments, the IC chip 8 may further include a temperature control circuit or include only the temperature control circuit. In the process of surface-mounting the IC chip 8 to a circuit wiring pattern 7 formed in the bottom cavity 3 of the container body 1, bumps 9 configured on a mounting surface (at one side) of the IC chip 8 are fixed to pads 7a of the circuit wiring pattern 7 formed on a bottom surface of the bottom cavity 3 by an adhesion means, such as ultrasonic bonding.

The circuit wiring pattern 7, formed in the bottom cavity 3 of the container body 1 at a side facing the IC chip 8, and a circuit wiring pattern 4b, formed in the top cavity 2 at a side facing the crystal resonator 4, are connected with each other by a through hole or via hole (not shown in the figures) configured in the constructive layer 1b. In addition, a plurality of terminals 10 are disposed on edges of the bottom cavity 3 for connecting to an external circuit (terminal pads of a circuit wiring pattern of the apparatus that mounts the piezoelectric device) by surface mounting. The terminals 10 are connected with the circuit wiring pattern 4b or 7 of the container body 1 also via a through hole or via hole (not shown in the figures) configured in the constructive layers of the container body 1. However, the formation of the terminals 10 is not limited to the above descriptions.

The bottom cavity 3, in which the IC chip 8 is mounted, including a gap between the bottom cavity 3 and the mounting surface of the IC chip 8, is exposed to the external atmosphere. That is, the gap where the pads 7a are configured to connect the bumps 9 is also exposed to the external atmosphere (usually air). According to the above, since humidity absorption does not occur in this gap to vary the stray capacitance, the problem of frequency variation of the conventional surface mount piezoelectric device is suppressed.

Figure 3A:
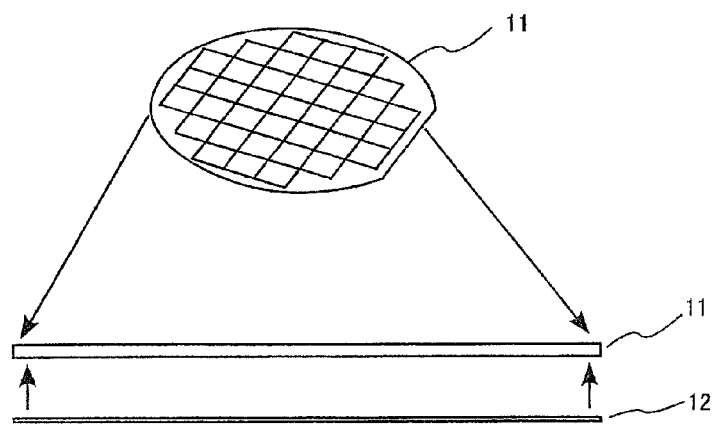
FIGS. 3A~3B are schematic views, which depict a resin sheet material being adhered to a wafer of IC chips according to a fabricating method of the first embodiment of the invention.
Figure 3B:
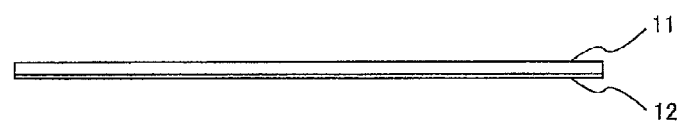
Figure 4A:
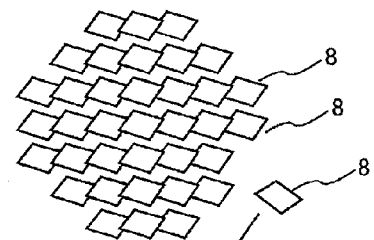
FIGS. 4A~4B illustrate a status that the wafer of FIGS. 3A~3B is cut into separate IC chips.
Figure 4B:
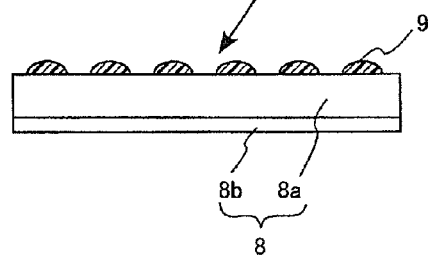

A fabricating method of the surface mount piezoelectric device according to the invention is explained below with reference to FIGS. 3A, 3B, 4A, 4B, 5A~5C, 6A and 6B. FIGS. 3A~3B are schematic views, which depict a resin sheet material being adhered to a semiconductor wafer 11 (referred to as "wafer" hereinafter), which serves as a base substrate of IC chips, according to the fabricating method of the surface mount piezoelectric device of the invention. FIGS. 3A~3B are corresponding to the first embodiment of the invention. FIGS. 4A~4B illustrate a status that the wafer 11 of FIGS. 3A~3B is cut into separate IC chips. The IC chip has a desired circuit that is respectively formed in the wafer 11 by a known fabricating process.

After forming the desired circuit and performing the fixed processes, such as forming a protective film on a front surface of the wafer 11, a rear surface (to be used as the back surface of the IC chip) of the wafer 11 is polished (back-grinding) to a fixed thickness. Then, as shown in FIG. 3A, a resin sheet 12 formed of an epoxy resin mixed with a filler such as silicon particles is adhered to the wafer 11. FIG. 3B illustrates a status that the resin sheet 12 is adhered to the wafer 11.

FIG. 4A depicts the IC chips 8, wherein the separate IC chips are resulted from the dicing of the wafer 11. The resin sheet 8b is adhered to a back surface (the other side of the side where the bumps 9 are formed) of the chip body 8a, as shown in FIG. 4B.

Figure 5A:
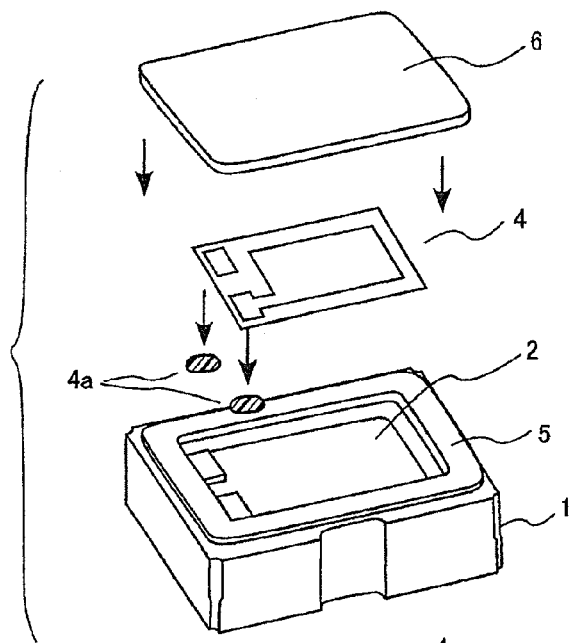
FIGS. 5A~5C are schematic perspective views illustrating the fabricating method of the surface mount piezoelectric device according to the first embodiment of the invention.
Figure 5B:
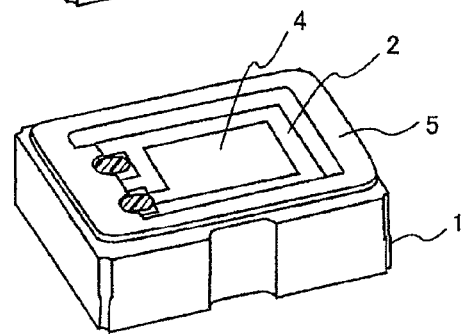
Figure 5C:
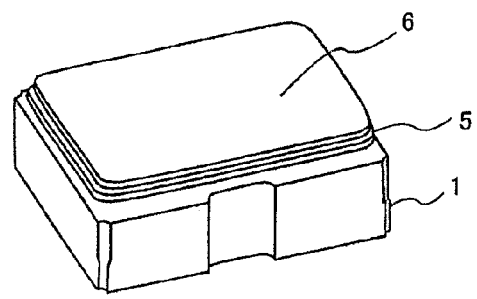

FIGS. 5A~5C are schematic perspective views showing the fabricating method of the surface mount piezoelectric device according to the first embodiment of the invention. FIG. 5A is an exploded view showing the elements of the top cavity part of the surface mount piezoelectric device, and illustrates that the top cavity 2 is formed in the container body 1, the crystal resonator 4 is installed on a wiring terminal (not shown in the figure) that is disposed in the top cavity 2 via the electrically-conductive adhesive agent 4a, and the metallic cover body 6 is adhered and fixed via the metal ring 5. FIG. 5B illustrates a status of the crystal resonator 4 being disposed in the top cavity 2. FIG. 5C illustrates a status that the top cavity 2 is sealed by the cover body 6.

Figure 6A:
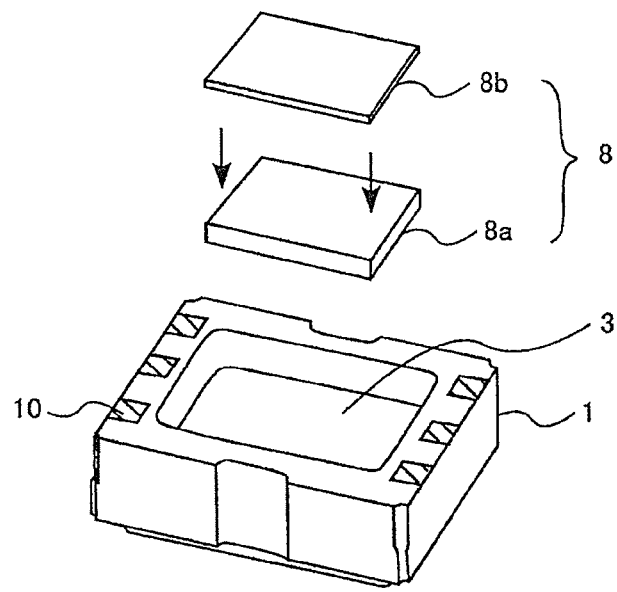
FIGS. 6A~6B are schematic perspective views subsequent to FIGS. 5A~5C to illustrate the fabricating method of the surface mount piezoelectric device according to the first embodiment of the invention.
Figure 6B:
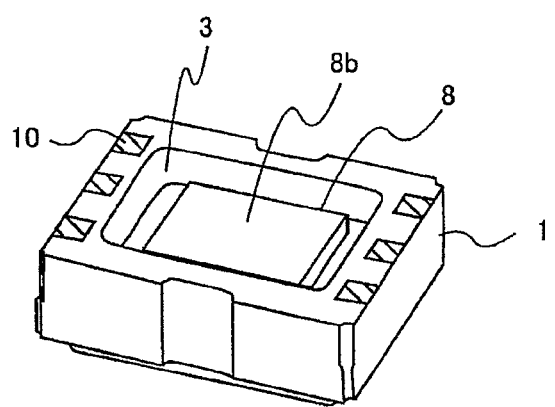

FIGS. 6A~6B are perspective views subsequent to FIGS. 5A~5C to illustrate the fabricating method of the surface mount piezoelectric device according to the first embodiment of the invention. FIG. 6A is an exploded view showing a process of mounting the IC chip 8 in the bottom cavity 3 of the container body 1, wherein the IC chip body 8a and the resin sheet that is to be adhered to the back surface of the IC chip 8 are separated. FIG. 6B illustrates a status that the IC chip 8 has been mounted in the bottom cavity 3.

According to the above-described fabricating method, the damage that may occur when the IC chip contacts the sidewall or corner of the cavity during the mounting process is prevented by adhering the insulating protective sheet, formed of organic resin, to the IC chip to protect the IC chip. Accordingly, the probability of defective piezoelectric devices is reduced. Moreover, because the process of filling the organic resin after disposing the IC chip in the cavity is omitted, the overall fabricating processes are reduced to lower the costs.

Second Embodiment

Figure 7:
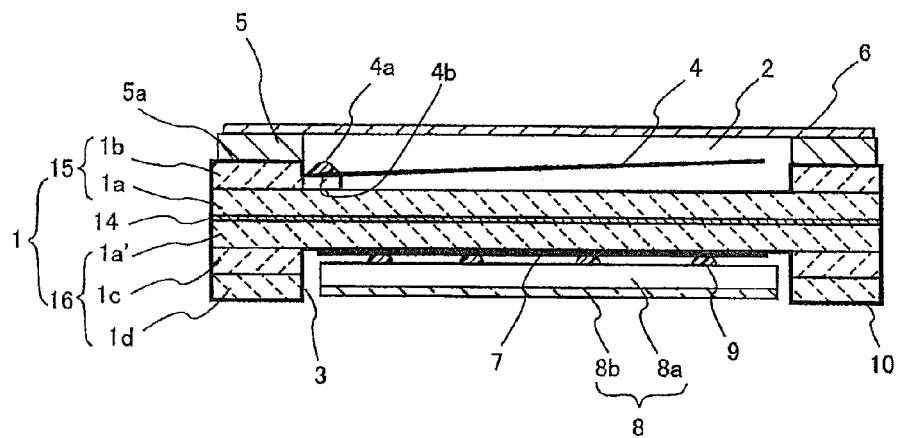
FIG. 7 is a schematic longitudinal cross-sectional view of an H-shaped surface mount piezoelectric device according to the second embodiment of the invention.
Figure 8:
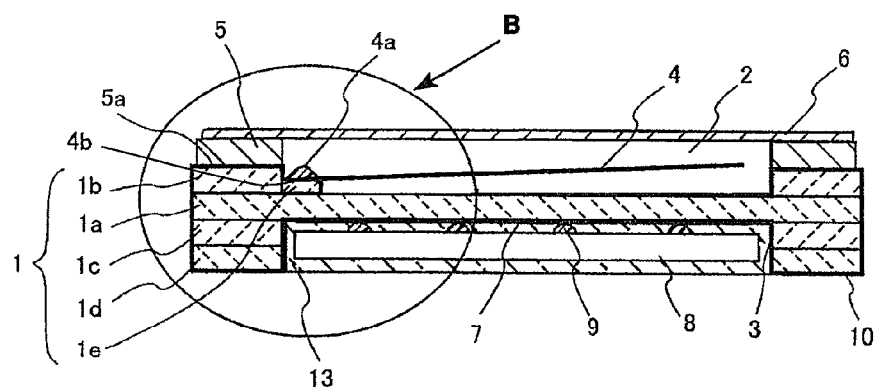
FIG. 8 is a schematic longitudinal cross-sectional view of a conventional H-shaped surface mount piezoelectric device.
Figure 9:
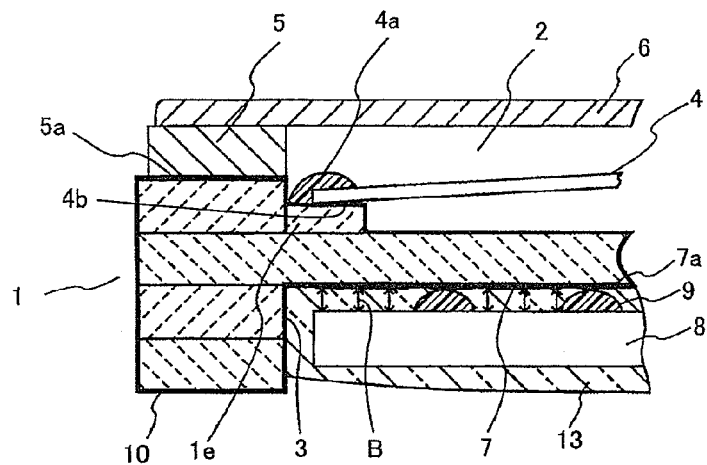
FIG. 9 is a schematic longitudinal cross-sectional view of a part of FIG. 8, as indicated by the arrow B.
Figure 10:
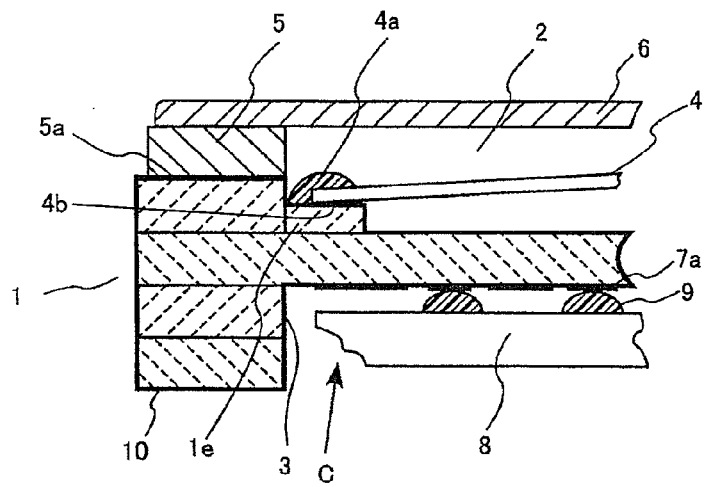
FIG. 10 is a schematic longitudinal cross-sectional view that also depicts the part of FIG. 8, the same as FIG. 9.

FIG. 7 is a schematic longitudinal cross-sectional view of an H-shaped surface mount piezoelectric device according to the second embodiment of the invention. In this embodiment, a top container body 15, for forming the top cavity 2, and a bottom container body 16, for forming the bottom cavity 16, are prepared separately, and then the top container body 15 and the bottom container body 16 are adhered to each other via an adhesive agent 14 to form the container body 1. The only difference between the second embodiment and the first embodiment is the structure of the container body 1. Regarding the installment of the crystal resonator 4 and the mounting of the IC chip 8, the second embodiment is the same as the first embodiment.

The surface mount piezoelectric device of the second embodiment produces the same effects as the first embodiment. In addition, the fabricating method of the surface mount piezoelectric device of the second embodiment is the same as the first embodiment. Therefore, detailed explanation of the fabricating method is omitted hereinafter.

INDUSTRIAL APPLICABILITY

The invention is applicable not only to the surface mount piezoelectric devices described in the above embodiments but also to any mounted device, which protects a mounted IC chip by filling an organic resin and the hygroscopicity of the organic resin hinders stable operation of the mounted device.

DESCRIPTION OF REFERENCE NUMERALS

1 ... container body (package)
2 ... top cavity
3 ... bottom cavity
4 ... crystal resonator
4a ... electrically-conductive adhesive agent
4b ... circuit pattern
5 ... metal ring
6 ... cover body
7 ... circuit pattern
8 ... IC chip
8a ... IC chip body
8b ... resin sheet
9 ... bump
10 ... terminal
11 ... wafer
12 ... resin sheet material
13 ... resin
14 ... adhesive agent
15 ... top container body
16 ... bottom container body

What is claimed is:

1. A piezoelectric device, at least comprising:
   an IC chip;
   a container body, having insulativity and comprising a top cavity for receiving a crystal resonator and a bottom cavity for receiving the IC chip, wherein the IC chip is surface-mounted in the bottom cavity;
   the crystal resonator, disposed in the top cavity; and
   a cover body, covering and sealing the top cavity,
   wherein the IC chip comprises:
      a bump, configured on a mounting surface of the IC chip facing the container body and connected with terminal pads of a circuit wiring pattern configured on a bottom surface of the bottom cavity; and
      a protective sheet having insulativity and adhered to a back surface of the IC chip, opposite to the mounting surface, wherein the protective sheet adhered to the back surface of the IC chip is formed of a thermosetting resin.

2. The piezoelectric device according to claim 1, wherein the container body is an HTCC (high temperature cofired ceramics) multi-layer wiring substrate and comprises a plurality of ceramics layers.

3. The piezoelectric device according to claim 2, wherein the multi-layer wiring substrate is integrally formed by high-temperature cofiring a first single-layer or multi-layer wiring substrate at a side of the top cavity and a second single-layer or multi-layer wiring substrate at a side of the bottom cavity simultaneously.

4. The piezoelectric device according to claim 2, wherein the multi-layer wiring substrate is integrally formed by high-temperature cofiring a first single-layer or multi-layer wiring substrate at a side of the top cavity and a second single-layer or multi-layer wiring substrate at a side of the bottom cavity separately, and then adhering surfaces of the first single-layer and the second single-layer or multi-layer wiring substrates to each other, wherein the surfaces are respectively opposite to the cavities.

5. The piezoelectric device according to claim 1, wherein the bottom cavity of the container body, in which the IC chip is mounted, is exposed to an external atmosphere.

6. The piezoelectric device according to claim 1, wherein the cover body is a plate of a metal material, and the cover body is adhered to the container body via a metal ring configured between edges of the container body that form the top cavity.

7. The piezoelectric device according to claim 1, wherein the thermosetting resin comprises epoxy resin.

8. The piezoelectric device according to claim 1, wherein a plurality of inorganic fillers are uniformly distributed in the thermosetting resin.

9. A fabricating method of a piezoelectric device, wherein the piezoelectric device at least comprises a container body having insulativity and comprising a top cavity for receiving a crystal resonator and a bottom cavity for receiving an IC chip of a plurality of IC chips, the crystal resonator disposed in the top cavity, the IC chip surface-mounted in the bottom cavity, and a cover body covering and sealing the top cavity, the fabricating method comprising:
   polishing a back surface of a semiconductor wafer, which has the plurality of IC chips, to a predetermined thickness before the semiconductor wafer is cut into the separate plurality of IC chips, the back surface being a surface opposite to a laminated circuit forming surface of the semiconductor wafer;
   adhering an insulating sheet to the back surface that has been polished to completely cover the back surface after the polishing;
   cutting the semiconductor wafer into the separate plurality of IC chips based on each unit of the plurality of IC chips to form the plurality of IC chips with protective sheets; and
   connecting bumps configured on a mounting surface of the IC chip with terminal pads of a circuit wiring pattern configured on a bottom surface of the bottom cavity of the container body inside the bottom cavity;
   wherein a space exists between the IC chip and the container body, the space includes a gap between the mounting surface of the IC chip and the container body, the protective sheet of the IC chip is exposed to an external atmosphere of the container body, and the protective sheet adhered to the back surface of the IC chip is formed of a thermosetting resin.

10. The fabricating method of the piezoelectric device according to claim 9, wherein
   the thermosetting resin comprises an epoxy resin.

11. The fabricating method of the piezoelectric device according to claim 9, wherein a plurality of inorganic fillers is uniformly distributed in the thermosetting resin.

\* \* \* \* \*